(12) United States Patent
Davari et al.

(10) Patent No.: US 6,188,122 B1
(45) Date of Patent: Feb. 13, 2001

(54) BURIED CAPACITOR FOR SILICON-ON-INSULATOR STRUCTURE

(75) Inventors: Bijan Davari, Mahopac; Effendi Leobandung, Wappingers Falls; Werner Rausch, Stormville; Ghavam G. Shahidi, Elmsford, all of NY (US)

(73) Assignee: International Business Machines Corporation, Armonk, NY (US)

( * ) Notice: Under 35 U.S.C. 154(b), the term of this patent shall be extended for 0 days.

(21) Appl. No.: 09/231,615

(22) Filed: Jan. 14, 1999

(51) Int. Cl.$^7$ .................................................. H01L 27/01
(52) U.S. Cl. ..................... 257/532; 257/347; 257/358; 257/303; 257/298; 257/311
(58) Field of Search .................. 257/347–358, 257/532, 298, 311, 303

(56) References Cited

U.S. PATENT DOCUMENTS

| | | | |
|---|---|---|---|
| 4,423,431 | 12/1983 | Sasaki | 357/41 |
| 4,791,610 | 12/1988 | Takemae | 365/149 |
| 4,839,707 | 6/1989 | Shields | 357/23.7 |
| 5,359,219 | 10/1994 | Hwang | 257/351 |
| 5,378,919 | * 1/1995 | Ochiai | 257/204 |
| 5,442,211 | 8/1995 | Kita | 257/301 |
| 5,447,882 | 9/1995 | Kim | 437/60 |
| 5,528,062 | 6/1996 | Hsieh et al. | 257/298 |
| 5,585,285 | 12/1996 | Tang | 437/21 |
| 5,606,188 | 2/1997 | Bronner et al. | 257/301 |
| 5,726,485 | 3/1998 | Grass | 257/532 |
| 5,759,907 | 6/1998 | Assaderaghi et al. | 438/386 |
| 5,770,875 | 6/1998 | Assaderaghi et al. | 257/301 |

* cited by examiner

*Primary Examiner*—Fetsum Abraham
(74) *Attorney, Agent, or Firm*—Ratner & Prestia; Joseph P. Abate, Esq.

(57) ABSTRACT

A process for making a capacitor for a silicon-on-insulator (SOI) structure. The SOI structure has a p-type silicon base layer, a buried oxide layer, a silicon layer, and an n$^+$ layer formed within a portion of the p-type silicon base layer. The process comprises the steps of forming a buried oxide layer and a silicon layer in the p-type silicon base layer, forming an n$^+$ layer in a portion of the p-type silicon base layer, and forming electrically conductive paths to the p-type silicon base layer and the n$^+$ layer extending through the buried oxide and silicon layers.

8 Claims, 5 Drawing Sheets

BURIED CAPACITOR FOR SILICON-ON-INSULATOR STRUCTURE

TECHNICAL FIELD

The present invention relates to a capacitor for a silicon-on-insulator (SOI) structure and, more particularly, to a capacitor buried in an SOI structure and to a process for fabrication.

BACKGROUND OF THE INVENTION

High-performance circuits require high-value, low-impedance decoupling capacitors between the DC power supply and ground lines to limit noise created by the rapid switching of current. This noise can arise, for example, due to inductive and capacitive parasitics. Ideally, decoupling capacitors are placed as close as possible to the load in order to enhance their effectiveness in reducing the noise in power and ground lines. Consequently, decoupling capacitors have been fabricated directly on the chip.

Unfortunately, the resistance of inversion capacitors for SOI (silicon-on-insulator) or bulk MOS (metal oxide semiconductor) high-performance circuits is excessively high for decoupling of high frequency noise because of the inversion layer resistance. Inversion layer resistance is representative of coupling impedance. Accumulation capacitors have proven to be effective in bulk MOS structures, but they are not a viable option for SOI structures because of the high resistance of the thin silicon layer on the insulator.

Furthermore, due to other device considerations, thinner SOI layers are constantly being sought. Thin SOI layers aggravate the decoupling problem. Unfortunately, none of the decoupling capacitor approaches commonly practiced for bulk MOS technologies provide a fully acceptable solution for high-performance SOI circuits.

An additional problem with SOI structures is caused by the poor thermal conductivity of the buried oxide layer: SOI devices that dissipate relatively high power levels are thrown out of electro-thermal equilibrium with their environment. Furthermore, SOI devices experience higher operating temperatures than their bulk device counterparts. One process of alleviating the high operating temperature problem is to increase the area of the gate layer over an inversion-type decoupling capacitor. Unfortunately, this approach suffers from the drawback that the approach increases the amount of silicon real estate required to constitute the fabricated circuit. Moreover, the SOI capacitors still have higher-than-desired impedance. Thus, the high inversion layer resistance described above is not easily solved in conventional SOI technology even by increasing the area of the capacitor.

The deficiencies of the conventional use of decoupling capacitors show that there is a need for a decoupling capacitor that effectively reduces noise in power and ground lines while minimally occupying valuable silicon real estate. To overcome the shortcomings of the conventional processes, a new process is provided. An object of the present invention is to provide a decoupling capacitor of very low impedance for high-performance circuits, such as those fabricated with SOI and MOS technology. A related object is to provide a low-impedance decoupling capacitor that preserves valuable silicon real estate while also reducing noise in the power and ground lines.

SUMMARY OF THE INVENTION

To achieve these and other objects, and in view of its purposes, the present invention provides a buried decoupling capacitor (hereinafter "buried capacitor") in the body of a p-type silicon base layer in the space under an active semiconductor device. This structure results in a buried capacitor in an SOI structure. The buried capacitor is a p-$n^+$ junction. The process of the invention comprises the steps of:

forming a buried oxide layer and a silicon layer in a p-type silicon base layer;

forming an $n^+$ layer extending parallel to the buried oxide layer in a portion of the p-type silicon base layer; and forming electrically conductive paths to the p-type silicon base layer and the $n^+$ layer extending through the buried oxide and silicon layers. The $n^+$ layer can be formed ether adjacent the p-type silicon base layer surface or below the p-type silicon base layer surface. In addition, the $n^+$ layer can be formed either as a uniform layer or as a plurality of discreet $n^+$ layers.

It is to be understood that both the foregoing general description and the following detailed description are exemplary, but are not restrictive, of the invention.

BRIEF DESCRIPTION OF THE DRAWING

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures.

DETAILED DESCRIPTION OF THE INVENTION

The invention will next be described with reference to the drawing in which similar numbers indicate the same elements in all figures. Such figures are intended to be illustrative rather than limiting and are included to facilitate the explanation of the structure of the present invention.

The invention is directed to an SOI structure having a buried capacitor under an active device in a p-type silicon base layer. The invention is also directed to a process of fabricating such a structure. By forming a capacitor buried below the active semiconductor device, valuable space adjacent active semiconductor devices is conserved.

The first step in the process of the present invention comprises forming a buried oxide layer between a silicon layer and a p-type silicon base layer. There are several processes known in the art for forming this structure. A preferred process is the separation by implanted oxygen (SIMOX) process. This process comprises the steps of implanting a heavy dose of oxygen ions into a p-type silicon base layer followed by an annealing step producing a buried oxide layer below a thin, single crystal silicon layer.

Before formation of a buried oxide layer, the p-type silicon base layer can optionally be implanted with acceptor ions to increase the positive charge of the p-type silicon base layer. Examples of useful acceptors include boron, aluminum, indium, and gallium ions. In a preferred embodiment, boron ions are implanted into the p-type silicon base layer to increase the positive charge of the p-type silicon base layer.

Following formation of the buried oxide layer between a p-type silicon base layer and silicon layer, an $n^+$ layer is formed. The $n^+$ layer is formed so as to be non-coextensive with the p-type silicon base layer and buried oxide layer. The $n^+$ layer is formed in the p-type silicon base layer using processes commonly known in the art.

In a preferred embodiment, formation of the $n^+$ layer is by mid-level UV (MUV) lithography. Forming the $n^+$ layer using MUV lithography comprises the steps of: depositing a photoresist layer on the silicon layer; exposing and removing a portion of the photoresist layer; and implanting donor ions into the exposed portion of the p-type silicon base layer, wherein the photoresist layer shields donor implantation on the region of the p-type silicon base layer underlying the photoresist layer. In an alternative embodiment, the $n^+$ layer is formed after the formation of an active device, the steps of which are described below. It is preferred, however, that the $n^+$ layer is formed before formation of the active device.

Figure 1:
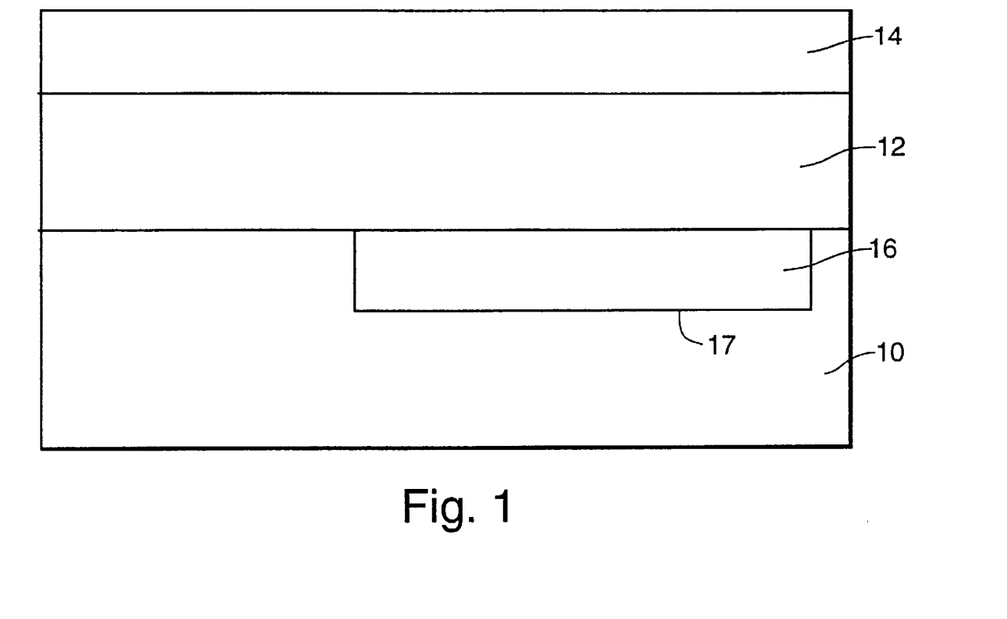
FIG. 1 shows an SOI structure having a p-type silicon base layer, a buried oxide layer, and a silicon layer, in which the p-type silicon base layer has a buried $n^+$ layer adjacent the buried oxide layer.
Figure 2:
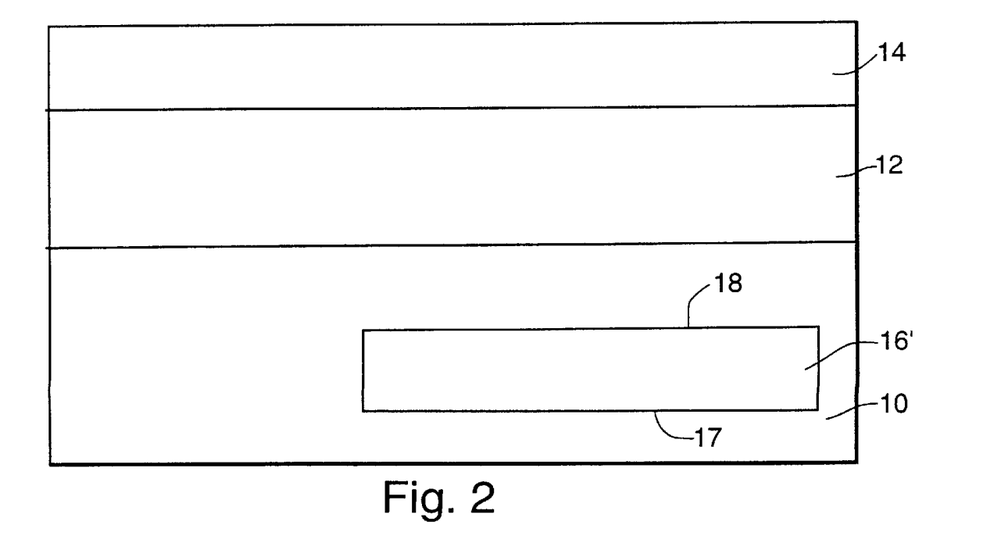
FIG. 2 shows an SOI structure having a p-type silicon base layer, a buried oxide layer, and a silicon layer, in which the buried $n^+$ layer is fully encompassed within an interior of the p-type silicon base layer.

FIGS. 1 and 2 illustrate the structure resulting from the steps of forming the buried oxide layer and forming the $n^+$ layer. Both figures show a p-type silicon base layer 10, a buried oxide layer 12, a silicon layer 14, and an $n^+$ layer 16 (FIG. 1) or 16' (FIG. 2). As illustrated in FIG. 1 and in FIG. 2, $n^+$ layer 16, 16' can be formed at differing positions within the p-type silicon base layer 10.

In the embodiment illustrated in FIG. 1, $n^+$ layer 16 is formed adjacent buried oxide layer 12. The top surface of $n^+$ layer 16 is parallel to and substantially co-linear with the top surface of p-type silicon base layer 10. A p-$n^+$ junction is formed where the bottom surface 17 of the $n^+$ layer 16 contacts the p-type silicon base layer 10. P-$n^+$ junctions on the side surfaces of the $n^+$ layer 16 are negligible because the thickness of the $n^+$ layer 16 is generally only about 0.5 $\mu$ to 1.0 $\mu$.

The embodiment of FIG. 2 shows an $n^+$ layer 16' that is fully encompassed within the p-type silicon base layer 10. A first p-$n^+$ junction is formed at the interface between the bottom surface 17 of the $n^+$ layer 16' and the p-type silicon base layer 10. Formation of a second p-$n^+$ junction at the interface between the top surface 18 of the $n^+$ layer 16' and the p-type silicon base layer 10 requires reformation of the p-type silicon base layer 10, which received a donor dose in forming the $n^+$ layer, adjacent the top surface 18 of the $n^+$ layer 16'. This reformation can be accomplished by implanting acceptor ions into an area of the p-type silicon base layer 10 adjacent the top surface 18 of the $n^+$ layer 16'. Forming the $n^+$ layer 16' so as to be fully encompassed by the p-type silicon base layer 10 creates p-$n^+$ junctions at the top surface 18 and bottom surface 17 of the $n^+$ layer 16', thereby doubling the total capacitance. P-$n^+$ junctions on the side surfaces of the $n^+$ layer 16' are negligible given the thickness of the $n^+$ layer 16'.

Figure 3:
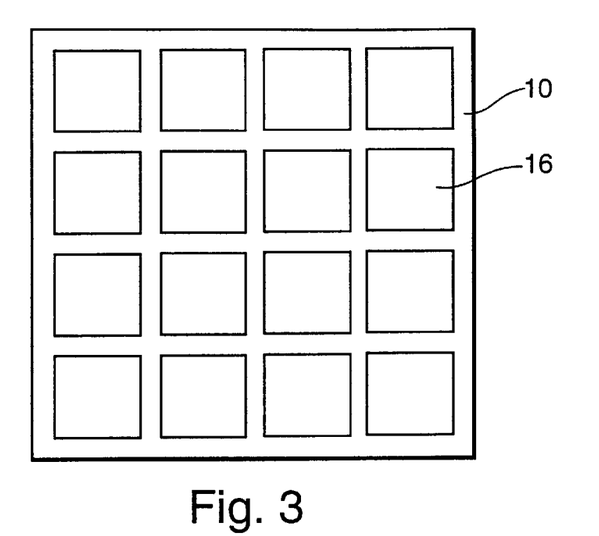
FIG. 3 shows a top view of an $n^+$ layer comprised of a plurality of discreet $n^+$ layers.

The $n^+$ layer 16, 16' can be formed either as a uniform layer or as a plurality of discreet layers connected in parallel. A plurality of discreet $n^+$ layers 16, as illustrated in FIG. 3 (and illustrated in FIG. 7, described below), can be formed by using an implant mask having small holes. An advantage of discreet $n^+$ layers 16 is that they allow electrical connection between each $n^+$ layer 16, thereby reducing substrate resistance. In addition, individual $n^+$ layers 16 can be turned off if they are defective without losing complete capacitance. In a preferred embodiment, the $n^+$ layer 16, 16' comprises a plurality of discreet $n^+$ layers.

As a result of the steps described above, a p-$n^+$ junction is formed. This p-$n^+$ junction, which is a type of diode, comprises a transition region between a p-type material and an $n^+$-type material. The transition region has a significant potential gradient between the positively charged $n^+$ region and the negatively charged p region. As a result of this potential gradient, p-$n^+$ junctions behave like capacitors. A p-$n^+$ junction differs from p-n junctions in that the doping density of donor ions in the $n^+$ layer is much higher in the p-$n^+$ junction than in a p-n junction.

Following formation of the p-$n^+$ junction, an active semiconductor device (active device) is formed on the silicon layer 14. There are several active semiconductor devices known in the art, such as field effect transistors (FET). There are two major types of FET's, the insulated-gate FET, or IGFET, and the junction-gate FET, or JFET. An FET has a control gate, and source and drain regions formed in a substrate. The control gate is formed above a dielectric insulator that is deposited over the area between the source and drain regions. As voltage is applied to the control gate, mobile charged particles in the substrate form a conduction channel in the region between the source and drain regions. Once the channel forms, the transistor turns "on" and current may flow between the source and drain regions.

Figure 4:
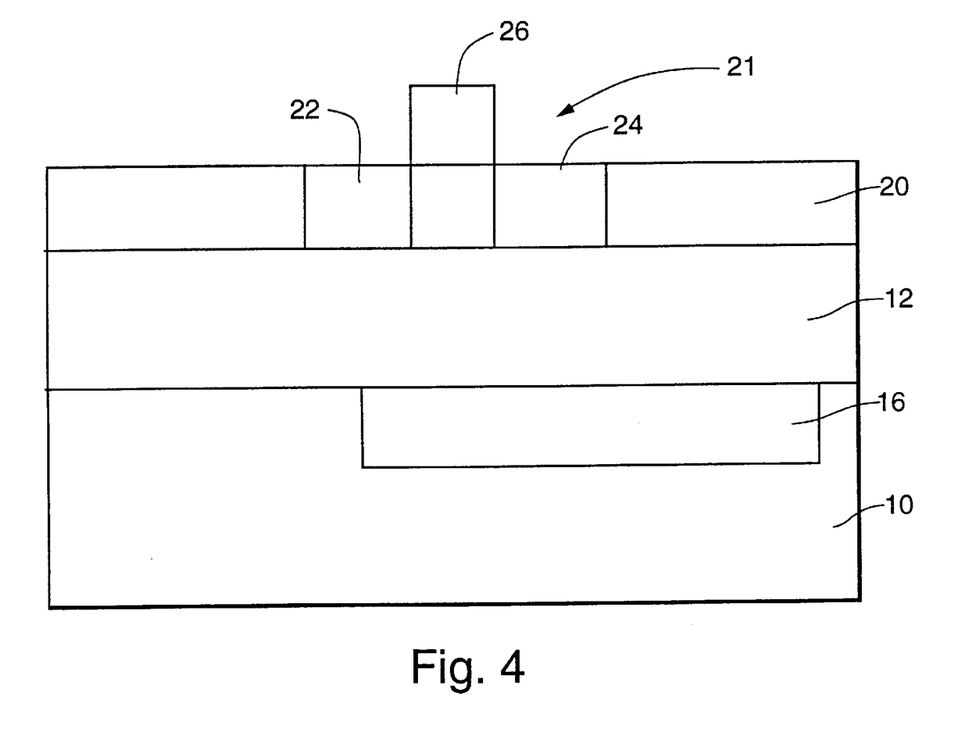
FIG. 4 shows the SOI structure having the buried $n^+$ layer of FIG. 1, additionally comprising an active semiconductor device formed in the silicon layer, and in which the portion of the silicon layer without an active semiconductor device has been oxidized to form a silicon oxide layer.

One process of forming an active device is by shallow trench isolation (STI) processing. In this process, which is illustrated in FIG. 4, trenches are first anisotropically etched into silicon layer 14 using dry etching techniques. Next, a chemical vapor deposition oxide is deposited in the etched trenches and etched back so that it remains only in the trenches, its top surface level with the surface of silicon layer 14. An active device is then created in those regions that were not formed into oxide-containing trenches. The resulting structure comprises an oxide layer 20 and an active device 21 comprising a source 22, a drain 24, and a gate 26. As previously stated, in an alternate embodiment, the active device 21 can be formed before the step of forming $n^+$ layer 16.

Figure 5:
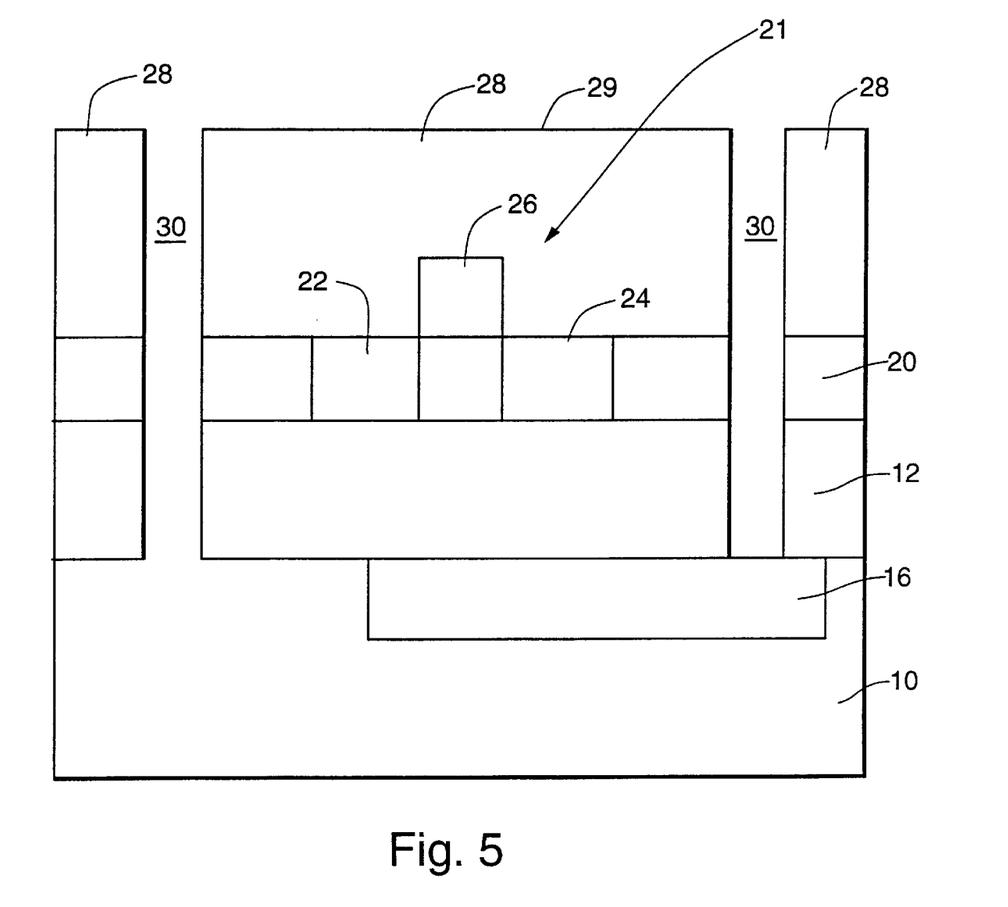
FIG. 5 shows the SOI structure of FIG. 4 having an insulating layer deposited on the structure and having contact vias formed extending from a surface of the insulating layer to the $n^+$ layer and p-type silicon base layer, respectively.

Following formation of the n+ layer 16 and active device 21, an insulating layer 28 is next deposited on the active device 21 and oxide layer 20, and the p-type silicon base layer 10 and n+ layer 16 are electrically contacted. In a preferred embodiment, which is illustrated in FIG. 5, insulating layer 28 is first deposited on oxide layer 20 and the active device 21. Next, the p-type silicon base layer 10 and n+ layer 16 are electrically connected by contact vias 30 which extend through the insulating layer 28, oxide layer 20, and buried oxide layer 12, to either the p-type silicon base layer 10 or n+ layer 16.

Figure 6:
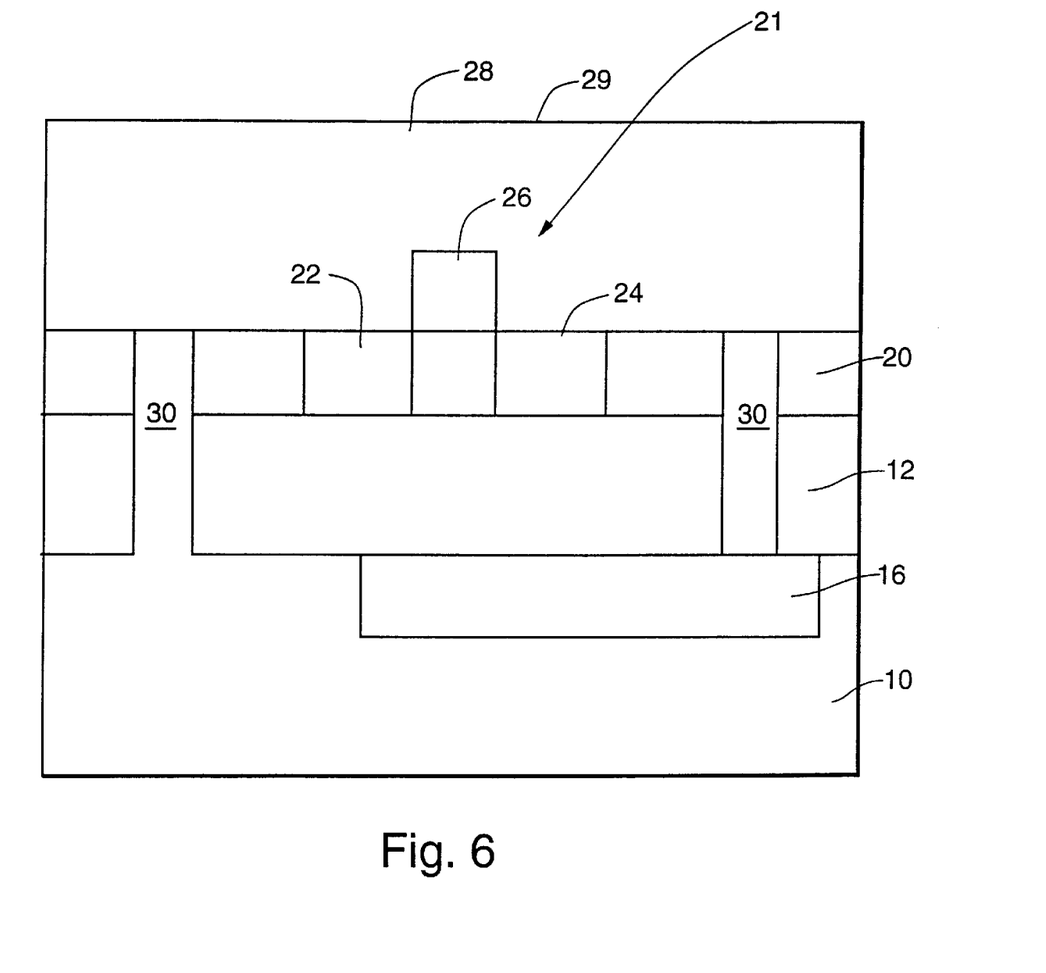
FIG. 6 shows the SOI structure of FIG. 4 having contact vias formed such that they extend from a surface of the oxide layer to the $n^+$ layer and p-type silicon base layer, respectively, and an insulating layer deposited on the structure.

In a second embodiment, which is illustrated in FIG. 6, contact vias 30 are first formed, followed by formation of the insulating layer 28. In this second embodiment, the contact vias 30 extend through the oxide layer 20 and buried oxide layer 12, and electrically contact either the n+ layer 16 or the p-type base silicon layer 10. The contact vias 30 of the second embodiment, as illustrated in FIG. 6, do not electrically connect the n+ layer 16 and p-type silicon base layer 10 to the surface 29 of insulating layer 28. These contact vias 30 may be extended to the surface 29 of the insulating layer 28 in a subsequent step, such as in the step of forming additional contact vias to electrically connect the active device 21.

Insulating layer 28 is formed on the active device 21 and oxide layer 20 using processes commonly known in the art, such as chemical vapor deposition (CVD). The insulating layer 28 can be selected from those insulating layers commonly known in the art. In a preferred embodiment, the insulating layer is borophosphosilicate glass (BPSG).

Figure 7:
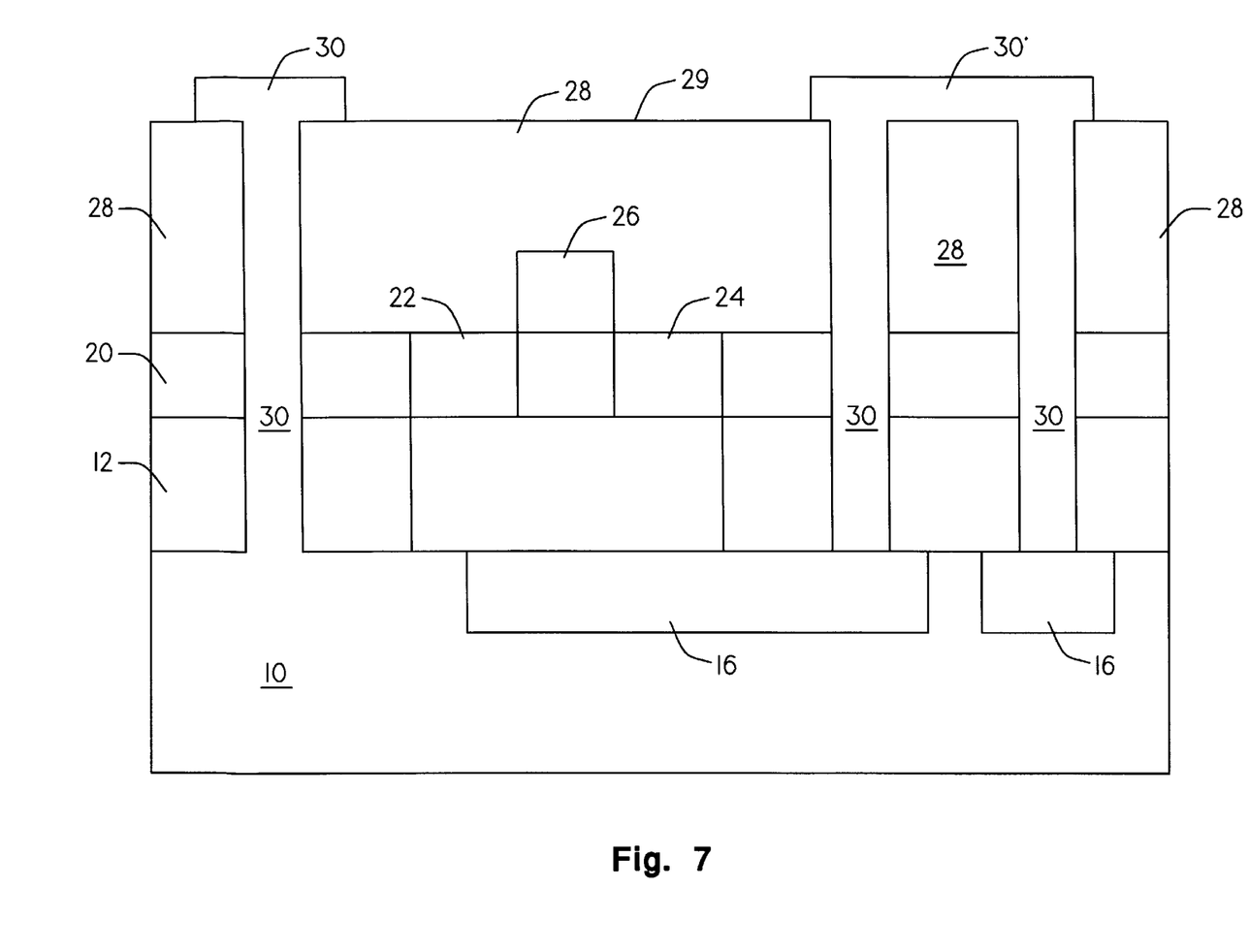
FIG. 7 shows an SOI structure having a p-type silicon base layer having a plurality of discreet $n^+$ layers, a buried oxide layer, a silicon layer, an active semiconductor device formed in the silicon layer, an insulating layer, a contact via extending to the p-type silicon base, and a contact via connecting the discreet $n^+$ layers in parallel.

As stated above, the n+ layer 16 can be formed as a uniform layer or as a plurality of discreet layers connected in parallel. FIGS. 5 and 6 illustrate embodiments of the invention having a uniform n+ layer 16 which is electrically contacted by a contact via 30. FIG. 7 illustrates an embodiment of the invention having a plurality of discreet n+ layers 16 connected in parallel. The n+ layers 16 shown in FIG. 7 are connected in parallel by a contact via 30'.

One process of forming electrically conductive paths to the p-type silicon base layer 10 and n+ layer 16 involves the creation of contact vias containing a conductive fill material. In this process, trenches are first formed by removing selected portions of the insulating layer 28 (first embodiment only), oxide layer 20, and buried oxide layer 12 to predetermined surface portions of the p-type silicon base layer 10 and n+ layer 16, corresponding to regions defined as contact vias for the capacitor. The contact vias can optionally be doped with acceptor ions at the p-type silicon base layer contact and donor ions at the n+ layer contact to ensure electrical connection before deposition of the conductive fill material in the trenches.

Following trench formation, a conductive fill material is deposited in the trenches by use of a selective deposition process, forming contact vias. Suitable conductive fill materials include tungsten, polysilicon, metal silicides, and polycides. A preferred conductive fill material is tungsten, which exhibits excellent deposition selectivity to the insulating layer 28 and oxide layer 20.

In one embodiment, an SOI structure having a buried capacitor in a p-type silicon base layer 10 was formed by the following steps. First, a p-type silicon base layer 10 was implanted with a dose of about $1 \times 10^{14}/cm^2$ boron ions at an energy of about 700 keV to increase the positive charge of the p-type silicon base layer 10. Next, using the SIMOX process, a buried oxide layer 12 and a silicon layer 14 were formed by implanting oxygen ions into the p-type silicon base layer 10 followed by an anneal.

Using MUV lithography, a photoresist layer having holes was deposited on the silicon layer 14. The photoresist layer was exposed and partially removed. A dose of about $1 \times 10^{14}/cm^2$ phosphorous ions at an energy of about 800 keV was next implanted into the portion of the p-type silicon base layer 10 not shielded by the photoresist layer, thereby forming a plurality of discreet n+ layers 16 under the oxide layer 12 on a portion of the p-type silicon base layer 10. A high-temperature oxidation at 1,000° C. was used to anneal the defects caused by the phosphorous ion implant in the p-type silicon base layer 10. Implanted ions of antimony or arsenic could have been used instead of phosphorous ions.

Next, an active device was formed in the silicon layer 14 using STI processing. First, trenches were anisotropically etched into the silicon layer 14 using dry etching. Next, an oxide was deposited in the etched trenches by CVD and etched back so that oxide remained only in the trenches and the top layer of the trenches was level with the original surface of the silicon layer 14. An active device 21 was then formed in those regions that were protected from the etch during trench formation.

Next, a BPSG insulating layer 28 was formed on the silicon layer 14 and active device 21 by plasma enhanced chemical vapor deposition. Trenches were then etched through the BPSG insulating layer 28, silicon layer 14, and oxide layer 20 to the p-type silicon base layer 10 and n+ layer 16 by dry etching. Tungsten was filled in the trenches, forming contact vias 30 which electrically connected the p-type silicon base layer 10 and n+ layer 16 to a p-type silicon base layer contact and n+ layer contact, respectively.

Although illustrated and described with reference to specific embodiments, the present invention is nevertheless not intended to be limited to the details shown. Rather, various modifications may be made in the details within the scope and range of equivalents of the claims and without departing from the spirit of the invention.

What is claimed is:

1. A silicon-on-insulator structure comprising:
   a p-type silicon base layer having formed thereon a buried oxide layer and an active silicon layer of a transistor on said buried oxide layer;
   an interlayer insulation disposed on said active silicon layer;
   an n+ layer formed within a portion of said p-type silicon base layer; and
   electrically conductive paths extending through said interlayer insulation and said buried oxide layer to said p-type silicon base layer and said n+ layer, respectively.

2. The silicon-on insulator structure according to claim 1 wherein the n+ layer is in contact with said buried oxide layer.

3. The silicon-on-insulator structure according to claim 1 further comprising an active device formed in said silicon layer above said n+ layer.

4. The silicon-on-insulator structure according to claim 3 further comprising an insulating layer on said silicon layer, wherein said electrically conductive paths extend through said insulating layer to said p-type silicon base layer and said n+ layer.

5. The silicon-on-insulator structure according to claim 1 wherein said n+ layer comprises a plurality of discreet $n^{30}$ layers which are interconnected in parallel.

6. The silicon-on-insulator structure according to claim 1 wherein said p-type silicon base layer has a top surface and said n+ layer has a top surface substantially co-linear with the top surface of the p-type silicon base layer.

7. A silicon-on-insulator structure having an exposed top surface, said silicon-on-insulator structure comprising:

a p-type silicon base layer having a top surface;

a buried oxide layer formed on said top surface of said p-type silicon base layer;

a silicon layer formed on said buried oxide layer;

an $n^+$ layer formed within a portion of said p-type silicon base layer and having a top surface substantially co-linear with said top surface of said p-type silicon base layer, said $n^+$ layer contacting said buried oxide layer;

an active device formed in said silicon layer above said $n^+$ layer; and an interlayer insulation disposed on said active device;

electrically conductive paths extending through said interlayer insulation surface and buried oxide layer to said p-type silicon base layer and said $n^+$ layer, respectively.

8. The silicon-on-insulator structure according to claim 7 wherein said $n^+$ layer comprises a plurality of discreet $n^+$ layers which are interconnected in parallel.

* * * * *

UNITED STATES PATENT AND TRADEMARK OFFICE
CERTIFICATE OF CORRECTION

PATENT NO. : 6,188,122 B1
DATED : February 13, 2001
INVENTOR(S) : Bijan Davari et al.

Page 1 of 1

It is certified that error appears in the above-identified patent and that said Letters Patent is hereby corrected as shown below:

Column 6, claim 5,
Line 62, delete "$n^{30}$" insert -- $n^+$ --.

Signed and Sealed this

Twenty-seventh Day of November, 2001

Attest:

*Attesting Officer*

NICHOLAS P. GODICI
*Acting Director of the United States Patent and Trademark Office*